(12) United States Patent
Terashima

(10) Patent No.: US 11,658,151 B2
(45) Date of Patent: May 23, 2023

(54) SEMICONDUCTOR DEVICE

(71) Applicant: FUJI ELECTRIC CO., LTD., Kawasaki (JP)

(72) Inventor: Kenshi Terashima, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 121 days.

(21) Appl. No.: 17/386,341

(22) Filed: Jul. 27, 2021

(65) Prior Publication Data
US 2022/0102316 A1 Mar. 31, 2022

(30) Foreign Application Priority Data

Sep. 25, 2020 (JP) .............................. JP2020-160708

(51) Int. Cl.
*H01L 25/065* (2023.01)
*H05K 1/18* (2006.01)
*H01L 23/043* (2006.01)
*H01L 23/538* (2006.01)

(52) U.S. Cl.
CPC ........ *H01L 25/0655* (2013.01); *H01L 23/043* (2013.01); *H01L 23/5386* (2013.01); *H05K 1/186* (2013.01)

(58) Field of Classification Search
CPC ............... H01L 25/0655; H01L 23/043; H01L 23/5386; H01L 24/06; H01L 24/48; H01L 24/49; H01L 2224/04042; H01L 2224/0603; H01L 2224/32225; H01L 2224/45015; H01L 2224/48111; H01L 2224/48137; H01L 2224/48139; H01L 2224/48227; H01L 2924/00014; H01L 2924/13055; H01L 2924/13091; H01L 2924/181; H01L 23/053; H01L 23/24; H01L 25/072; H01L 23/36; H01L 25/18; H01L 2224/49175; H05K 1/186; H05K 1/14; H05K 2201/10166; H05K 2201/10303; H05K 2203/049; H05K 1/0263; H05K 5/0213; H05K 1/181
See application file for complete search history.

(56) References Cited

U.S. PATENT DOCUMENTS

2018/0308775 A1 10/2018 Oose

FOREIGN PATENT DOCUMENTS

| JP | 2000-068446 A | 3/2000 |
| JP | 2009-289831 A | 12/2009 |
| JP | 2018-182174 A | 11/2018 |

*Primary Examiner* — Elias Ullah
(74) *Attorney, Agent, or Firm* — Rabin & Berdo, P.C.

(57) ABSTRACT

A semiconductor device includes a semiconductor unit, a printed circuit board and a case, including a bottom portion formed in a plate-like shape and a side wall portion surrounding an outer periphery of the bottom portion of the case. The bottom portion has a main circuit area having an opening, and a control circuit area adjacent to the main circuit area in a plan view. The semiconductor unit is attached in the main circuit area from a rear surface of the bottom portion such that an insulating plate of the semiconductor unit is exposed to inside the case through the opening. The printed circuit board is disposed in the control circuit area on the front surface of the bottom portion via a spacer, having a gap between the printed circuit board and the front surface of the bottom portion.

14 Claims, 10 Drawing Sheets

SEMICONDUCTOR DEVICE

CROSS-REFERENCE TO RELATED APPLICATIONS

This application is based upon and claims the benefit of priority of the prior Japanese Patent Application No. 2020-160708, filed on Sep. 25, 2020, the entire contents of which are incorporated herein by reference.

BACKGROUND OF THE INVENTION

1. Field of the Invention

The embodiments discussed herein relate to a semiconductor device.

2. Background of the Related Art

A semiconductor device includes power devices, which are, for example, semiconductor chips including insulated gate bipolar transistors (IGBTs) or power metal-oxide-semiconductor field-effect transistors (MOSFETs). In addition, an individual semiconductor chip is disposed on a main circuit board. The main circuit board includes circuit patterns and an insulating plate having a front surface on which the circuit patterns are formed. In addition, the semiconductor device includes electronic components. For example, the electronic components are control integrated circuits (ICs). These control ICs perform drive control processing on the semiconductor chips. In the case of such a semiconductor device called an intelligent power module (IPM), a printed circuit board on which control ICs are mounted is disposed on a bottom surface of the case via bonding material and next to a main circuit board on which semiconductor chips are disposed (for example, see Japanese Laid-open Patent Publication No. 2009-289831).

In the case of the above semiconductor device, the heat generated by the heated semiconductor chip conducts from the main circuit board to the adjacent printed circuit board. If the temperature of the printed circuit board rises, the temperature of the control ICs also rises. For example, if the guaranteed operating temperature of a control IC is lower than that of a semiconductor chip, the guaranteed operating temperature of the control IC is reached before the guaranteed operating temperature of the semiconductor chip is reached. As a result, the guaranteed operating temperature of the whole semiconductor device is not improved.

SUMMARY OF THE INVENTION

According to one aspect of the embodiments, there is provided a semiconductor device including: a semiconductor unit including a main circuit board, which includes an insulating plate, a circuit pattern formed on a front surface of the insulating plate, and a metal plate formed on a rear surface of the insulating plate, and a semiconductor chip bonded to the circuit pattern; a printed circuit board; and a case including a bottom portion formed in a plate-like shape and having a front surface and a rear surface opposite to each other, the rear surface facing outside the case, and a side wall portion surrounding an outer periphery of the bottom portion of the case, wherein the bottom portion has a main circuit area having an opening, the semiconductor unit being attached in the main circuit area from the rear surface of the bottom portion such that the insulating plate is exposed to inside the case through the opening, and a control circuit area adjacent to the main circuit area in a plan view of the semiconductor device, the printed circuit board being disposed in the control circuit area on the front surface of the bottom portion via a spacer, having a gap between the printed circuit board and the front surface of the bottom portion.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, embodiments will be described with reference to the accompanying drawings. In the following description, regarding a semiconductor device 10 in FIG. 2, terms "front surface" and "top surface" each mean an upward surface. Likewise, regarding the semiconductor device 10 in FIG. 2, a term "up" means an upward direction. In addition, regarding the semiconductor device 10 in FIG. 2, terms "rear surface" and "bottom surface" each mean a downward surface. Likewise, regarding the semiconductor device 10 in FIG. 2, a term "down" means a downward direction. In the other drawings, too, the above terms mean their respective directions, as needed. The terms "front surface", "top surface", "up", "rear surface", "bottom surface", "down", and "side surface" are only expressions used for the purpose of convenience to determine relative positional relationships and do not limit the technical concepts of the embodiments. For example, the terms "up" and "down" may mean directions other than the vertical directions with respect to the ground. That is, the directions expressed by "up" and "down" are not limited to the directions relating to the gravitational force. In the following description, when a component contained in material represents 80 vol % or more of the material, this component will be referred to as the "main component" of the material.

First Embodiment

A semiconductor device 10 according to a first embodiment will be described with reference to FIGS. 1 and 2. FIG.

Figure 1:
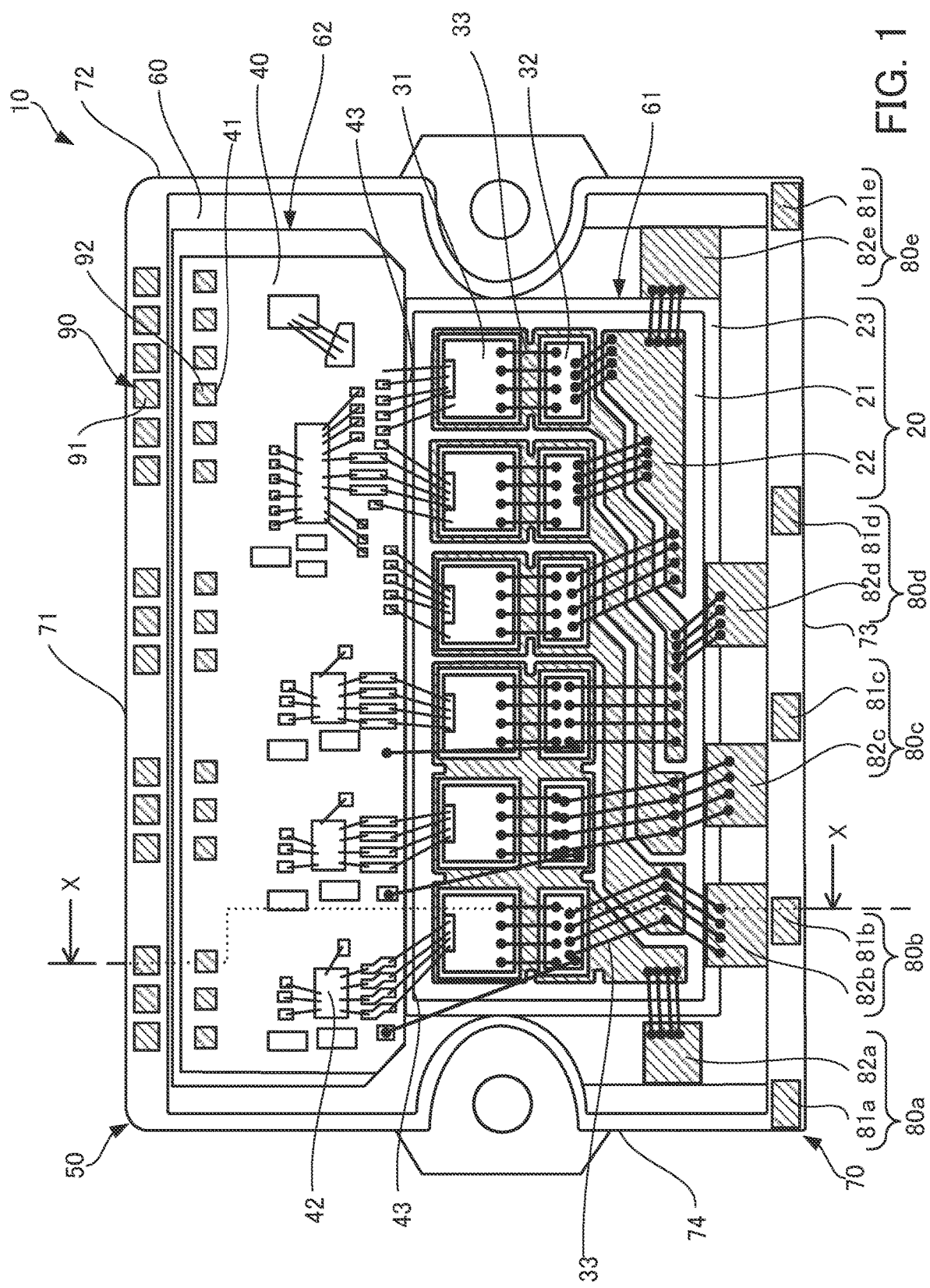
FIG. 1 is a plan view of a semiconductor device according to a first embodiment.
Figure 2:
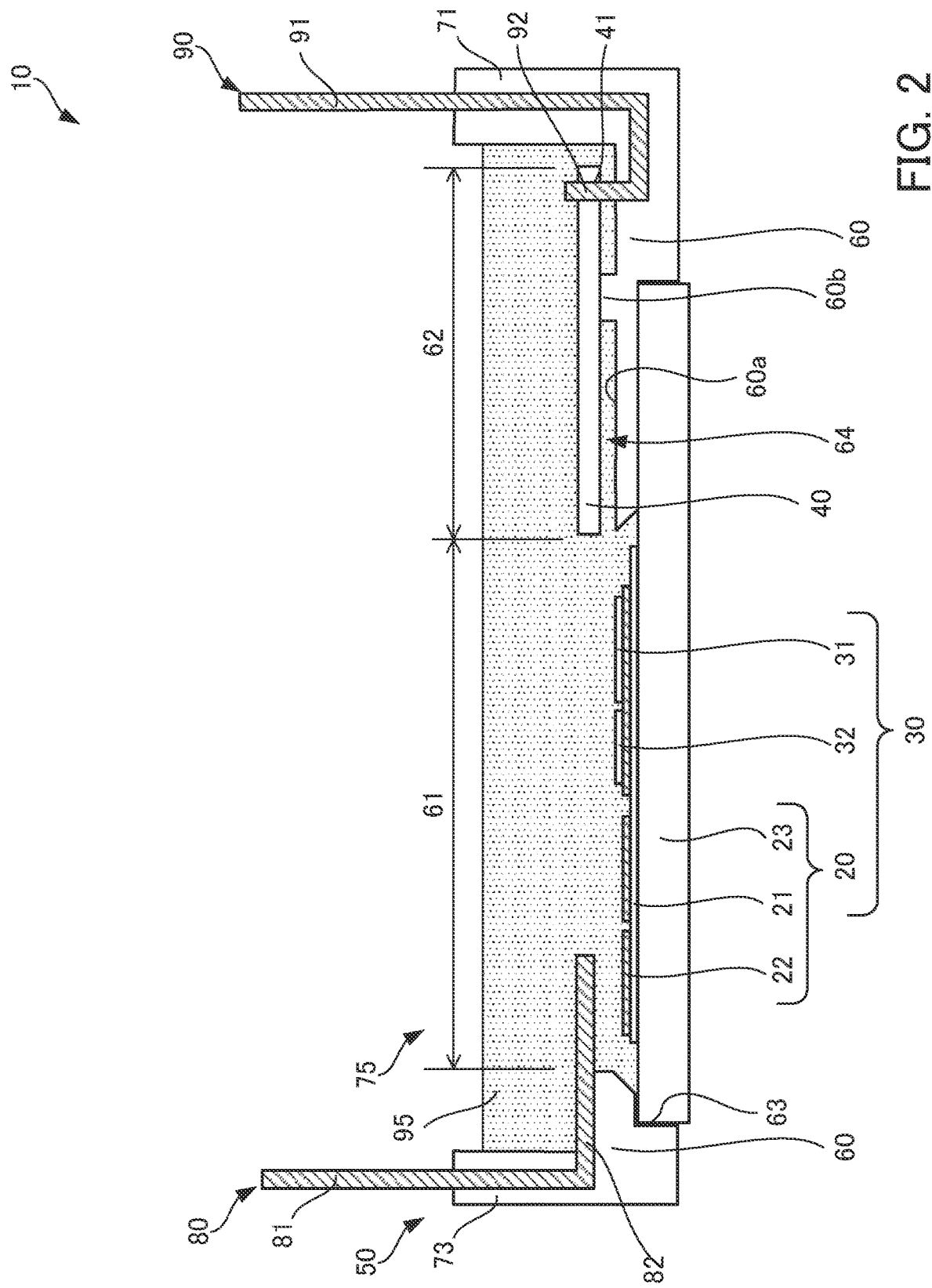
FIG. 2 is a sectional view of the semiconductor device according to the first embodiment.

1 is a plan view of the semiconductor device 10 according to the first embodiment, and FIG. 2 is a sectional view of the semiconductor device 10 according to the first embodiment. In FIG. 1, sealing material 95 is not illustrated. FIG. 2 is a sectional view of the semiconductor device 10 taken along a dashed-dotted line X-X in FIG. 1. In FIG. 2, bonding wires 33 and 43 and control ICs 42 are not illustrated.

The semiconductor device 10 includes a semiconductor unit 30, a printed circuit board 40, and a case 50 in which the semiconductor unit 30 and the printed circuit board 40 are stored. The semiconductor unit 30 includes a main circuit board 20 and first and second semiconductor chips 31 and 32 mounted on the main circuit board 20. The semiconductor unit 30 includes six sets of first and second semiconductor chips 31 and 32. The main circuit board 20 includes an insulating plate 21, circuit patterns 22, and a metal base board 23.

For example, an organic insulating layer or a ceramic board may be used as the insulating plate 21. The organic insulating layer is formed by a combination of resin having small thermal resistance and material having large thermal conductivity. The former resin is, for example, epoxy resin or liquid crystal polymer insulating resin. The latter material is, for example, boron nitride, aluminum oxide, or silicon oxide. The ceramic board is made of ceramic material having good thermal conductivity. The ceramic material is made of, for example, material having aluminum oxide, aluminum nitride, or silicon nitride as its main component. The insulating plate 21 has a rectangular shape in a plan view. In addition, the insulating plate 21 has a thickness between 0.5 mm and 2.0 mm, inclusive.

The circuit patterns 22 constitute predetermined circuits. For example, one circuit pattern 22 is formed on the left side of the front surface of the insulating plate 21, and three sets of first and second semiconductor chips 31 and are mounted on this circuit pattern 22. In addition, three circuit patterns 22 are formed on the right side of the front surface of the insulating plate 21, and one set of first and second semiconductor chips 31 and 32 is mounted on each of the three circuit patterns 22. There is also one circuit pattern 22 on which no semiconductor chips are mounted. In addition, regarding these circuit patterns 22, the insulating plate 21 has one area where the first and second semiconductor chips 31 and 32 are disposed, and this area extends in the upper portion in FIG. 1. The insulating plate 21 has another area where the first and second semiconductor chips 31 and 32 are not disposed, and this area extends in the lower portion in FIG. 1. While a total of six sets of first and second semiconductor chips 31 and 32 are formed on the circuit patterns 22, a different number of sets of first and second semiconductor chips 31 and 32 may alternatively be formed. That is, for example, an appropriate number of sets may be determined depending on the specifications of the semiconductor device 10, and an appropriate number of circuit patterns 22 may be formed depending on the determined number of sets. The plurality of circuit patterns 22 are formed on the front surface of the insulating plate 21. In addition, metal material having excellent electrical conductivity is used as the main component of the individual circuit pattern 22. The metal material is, for example, silver, copper, nickel, or an alloy containing at least one of these kinds. The individual circuit pattern 22 has a thickness between 0.5 mm and 1.5 mm, inclusive. The surface of the individual circuit pattern 22 may be plated to improve its corrosion resistance. The material used for this plating is, for example, nickel, a nickel-phosphorus alloy, or a nickel-boron alloy. The individual circuit pattern 22 is formed by etching an electrically conductive plate or foil formed on one surface of the insulating plate 21. Alternatively, the individual circuit pattern 22 is formed by attaching an electrically conductive plate to one surface of the insulating plate 21. The individual circuit pattern 22 has a thickness preferably between 0.1 mm and 1.0 mm, inclusive, more preferably, between 0.2 mm and 0.5 mm, inclusive.

Metal material having excellent thermal conductivity is used as the main component of the metal base board 23. Corners of the metal base board 23 may be rounded. The metal material is, for example, aluminum, iron, silver, copper, or an alloy containing at least one of these kinds. In addition, the metal base board 23 has a rectangular shape in a plan view and corresponds to a main circuit area 61 and a control circuit area 62 (which will be described below) at a bottom portion 60 of the case 50. The metal base board 23 has a thickness between 0.5 mm and 2.0 mm, inclusive. The surface of the metal base board 23 may be plated to improve its corrosion resistance. The material used for this plating is, for example, nickel, a nickel-phosphorus alloy, or a nickel-boron alloy.

If a ceramic board is used as the insulating plate 21 and metal foil is used as the metal base board 23, a direct copper bonding (DCB) board or an active metal brazed (AMB) board may be used for the circuit patterns 22, the insulating plate 21, and the metal base board 23. The shapes, the arrangement, and the number of the circuit patterns 22 of the semiconductor unit 30 having the above configuration are only examples. The arrangement and the number of first and second semiconductor chips 31 and 32 are also only examples. That is, these shapes, arrangements, and numbers may be suitably changed from those illustrated in FIGS. 1 and 2, depending on the design, etc.

The first and second semiconductor chips 31 and 32 are power semiconductor chips made of silicon, silicon carbide, or gallium nitride. The individual first semiconductor chip 31 includes a switching element. Examples of the switching element include an IGBT and a power MOSFET. If the first semiconductor chip 31 is an IGBT, the first semiconductor chip 31 has a collector electrode as a main electrode on its rear surface and a gate electrode and an emitter electrode as a main electrode on its front surface. If the first semiconductor chip 31 is a power MOSFET, the first semiconductor chip 31 has a drain electrode as a main electrode on its rear surface and a gate electrode and a source electrode as a main electrode on its front surface. The rear surface of the individual first semiconductor chip 31 as described above is bonded to a corresponding circuit pattern 22 via bonding material (not illustrated). In the present embodiment, solder or metal sintered compact is used as the bonding material. The solder is lead-free solder containing a predetermined alloy as its main component. The predetermined alloy is, for example, at least one of a tin-silver alloy, a tin-zinc alloy, and a tin-antimony alloy. An additive such as copper, bismuth, indium, nickel, germanium, cobalt, or silicon may be contained in the solder. For example, aluminum or copper is used for the metal sintered compact.

The individual second semiconductor chip 32 includes a diode element. The diode element is, for example, a free wheeling diode (FWD) such as a Schottky barrier diode (SBD) or a P-intrinsic-N (PiN) diode. This second semiconductor chip 32 has an output electrode (a cathode electrode) as a main electrode on its rear surface and an input electrode (an anode electrode) as a main electrode on its front surface. The rear surface of the individual second semiconductor chip 32 as described above is bonded to a corresponding circuit pattern 22 via bonding material.

For example, the first and second semiconductor chips 31 and 32 each have a thickness between 180 µm and 220 µm, inclusive. The average of the thicknesses is about 200 µm. For example, the guaranteed operating temperature of the first and second semiconductor chips 31 and 32 is 145° C. or less. If high-temperature operations of the first and second semiconductor chips 31 and 32 are guaranteed, the guaranteed operating temperature is 165° C. or less, for example. That is, there are cases where the first and second semiconductor chips 31 and 32 are used at 145° C. In addition, if high-temperature operations are guaranteed, the first and second semiconductor chips 31 and 32 could be used at 165° C. In place of the first and second semiconductor chips 31 and 32, reverse-conducting (RC)-IGBTs, each of which has both functions of an IGBT and an FWD, may be used. Even when these RC-IGBTs are used in place of the above first and second semiconductor chips 31 and 32, the guaranteed operating temperature is the same as that of the first and second semiconductor chips 31 and 32.

The printed circuit board 40 is disposed in the upper portion in FIG. 1 and is adjacent to the main circuit board 20 disposed horizontally with respect to a bottom surface 60a of the case 50. This printed circuit board 40 includes an insulating plate and a plurality of upper circuit patterns formed on the front surface of the insulating plate. In addition, the printed circuit board 40 may include a plurality of lower circuit patterns on the rear surface of the insulating plate. In addition, a plurality of through-holes 41 pass through predetermined locations of the printed circuit board 40 from the front surface to the rear surface thereof. For example, the predetermined locations correspond to an edge of the printed circuit board 40, the edge being on the far side from the main circuit area 61.

The insulating plate has a plate-like shape and is made of insulating material. A base may be immersed in resin, to obtain the insulating material. As this base, for example, paper, glass fabric, or glass non-woven fabric is used. As the resin, for example, phenol resin, epoxy resin, or polyimide resin is used. Specific examples of the insulating plate include a paper phenol board, a paper epoxy board, a glass epoxy board, a glass polyimide board, and a glass composite board. The insulating plate as described above also has a rectangular shape in a plan view. Corners of the insulating plate may be chamfered into a rounded or beveled shape.

The plurality of upper circuit patterns and the plurality of lower circuit patterns have shapes of predetermined patterns such that predetermined circuits are formed. The upper circuit patterns and the lower circuit patterns are made of material having excellent electrical conductivity. Examples of the material include silver, copper, nickel, and an alloy containing at least one of these kinds. The surfaces of the upper circuit patterns and the lower circuit patterns may be plated to improve their corrosion resistance. The material used for this plating is, for example, nickel, a nickel-phosphorus alloy, or a nickel-boron alloy.

The printed circuit board 40 as described above is formed as follows, for example. Metal foil is attached to both of the front and rear surfaces of an insulating plate, and a predetermined shape of resist is printed. The metal foil on the front surface and the rear surface of the insulating plate is etched by using the printed resist as a mask, and the residual resist is removed. In this way, the upper circuit patterns are formed on the front surface of the insulating plate, and the lower circuit patterns are formed on the rear surface of the insulating plate. Next, by performing drilling, holes are made in predetermined location of the multilayer body of the insulating plate, the upper circuit patterns, and the lower circuit patterns, to form the plurality of through-holes 41. The through-holes 41 may be plated. For example, solder plating or electroless gold plating is performed. A water-soluble flux process may be performed.

In addition, the control ICs 42 are disposed as electronic components on the printed circuit board 40 and are electrically connected to the upper circuit patterns. In the present embodiment, as illustrated in FIG. 1, the control ICs 42 are electrically and mechanically connected to gate electrodes (control electrodes) of the first semiconductor chip 31 via the bonding wires 43. The individual control IC 42 applies a control voltage to a corresponding first semiconductor chip 31 at predetermined timing. The bonding wires 43 used herein are made of material having excellent electrical conductivity. Examples of the material include gold, silver, copper, aluminum, and an alloy containing at least one of these kinds. In addition, the bonding wires 43 each have a diameter, for example, between 100 µm and 250 µm, inclusive. Other than these control ICs 42, different electronic components may be disposed as needed on the printed circuit board 40. Examples of these electronic components include thermistors, capacitors, resistors, current sensors, and temperature sensors. In addition, the guaranteed operating temperature of the individual control IC 42 is lower than that of the first and second semiconductor chips 31 and 32. The guaranteed operating temperature of a normal control IC 42 is, for example, 115° C. or less. If a high-temperature operation of a control IC 42 is guaranteed, the guaranteed operating temperature of this control IC 42 is, for example, 130° C. or less. That is, when the normal control IC 42 is used at a temperature higher than 115° C., the normal control IC 42 could malfunction or could be damaged. In the case of the control IC 42 whose high-temperature operation is guaranteed, too, when used at a temperature higher than 130° C., the control IC 42 could malfunction or could be damaged.

It is preferable that the main circuit board 20 and the printed circuit board 40 as described above be arranged as follows. That is, it is preferable that the first and second semiconductor chips 31 and 32 be arranged on the main circuit board 20 such that these chips 31 and 32 do not overlap the printed circuit board 40 in a plan view. In addition, it is preferable that an extension of each of the front surfaces of the first and second semiconductor chips 31 and 32 be located within a gap 64 in a side view.

In addition, corresponding first and second semiconductor chips 31 and 32 are electrically and mechanically connected to each other on the main circuit board 20 via bonding wires 33. The second semiconductor chips 32 are also electrically and mechanically connected to corresponding circuit patterns 22 on the main circuit board 20 via bonding wires 33. The printed circuit board 40 is also electrically and mechanically connected to circuit patterns 22 on the main circuit board 20 via bonding wires 33. These bonding wires 33 used herein are also made of the above material having excellent electrical conductivity. The bonding wires 33 each has a diameter, for example, between 400 µm and 1.00 mm, inclusive.

Next, the case 50 will be described. The case 50 includes the bottom portion 60 and a frame portion 70 that is around the peripheral portions of the bottom portion 60 and that is integrally formed with the bottom portion 60. The case 50 also includes main current connection terminals 80a to 80e and control terminals 90. Hereinafter, when the main current connection terminals 80a to 80e are not particularly distinguished from each other, each of these main current connection terminals 80a to 80e will simply be referred to as "a main current connection terminal 80". This case 50 is formed to include the main current connection terminals 80 and the control terminals 90 by injection molding using thermoplastic resin, for example. The thermoplastic resin is, for example, polyphenylene sulfide (PPS) resin, polybutylene terephthalate (PBT) resin, polybutylene succinate (PBS) resin, polyamide (PA) resin, or acrylonitrile butadiene styrene (ABS) resin.

The bottom portion 60 has a rectangular shape in a plan view. The main circuit area 61 and the control circuit area 62 are set for the bottom surface 60a, which is the front surface of the bottom portion 60. The main circuit board 20 is disposed in the main circuit area 61, and the printed circuit board 40 is disposed in the control circuit area 62. That is, as illustrated in FIG. 1, the main circuit area 61 is set for the front surface of the bottom portion 60 in the lower portion in FIG. 1 in a plan view. In addition, the main circuit area 61 set for the bottom portion 60 is open. A tapered portion may be formed on the rear surface of an edge of the opening in the main circuit area 61. In addition, an opening portion 63 is also formed on the rear surface of the bottom portion 60. The opening portion 63 of the rear surface passes through the bottom portion in the main circuit area 61. The semiconductor unit 30 is attached to the bottom portion 60 from the rear surface thereof. That is, the metal base board 23 is attached to the opening portion 63 of the rear surface such that the main circuit board 20 is exposed from the open main circuit area 61. The metal base board 23 is attached to the opening portion 63 of the rear surface of the bottom portion 60 via bonding material (not illustrated). The rear surface of the metal base board 23 attached as described above protrudes more outwardly (in the lower direction in FIG. 2) than the rear surface of the bottom portion 60. The rear surface of the metal base board 23 may be formed to be on the same plane with the rear surface of the bottom portion 60.

For example, thermosetting resin adhesive or organic adhesive is used as the bonding material for bonding the metal base board 23 to the opening portion 63 of the rear surface of the bottom portion 60. The thermosetting resin adhesive includes epoxy resin or phenol resin as its main component, for example. The organic adhesive is, for example, elastomeric adhesive containing silicone rubber or chloroprene rubber as its component. Preferably, epoxy resin or silicone rubber is used as its main component.

The control circuit area 62 is set for the front surface of the bottom portion 60 and is adjacent to the main circuit area 61 on a side opposite to a side wall portion 73. Spacer portions 60b are formed in the control circuit area 62 on the bottom surface 60a of the bottom portion 60. These spacer portions 60b may be made of the same material as that of the case 50 including the bottom portion 60 and may be formed integrally with the bottom portion 60. Alternatively, the spacer portions 60b may be made of material different from that of the case 50 and may separately be formed in the control circuit area 62 on the bottom portion 60. In this case, the spacer portions 60b are made of resin, carbon, or metal material different from that of the case 50, for example. The present embodiment assumes an example in which the spacer portions 60b are made of the same material as that of the case 50 and are formed integrally with the bottom portion 60. The printed circuit board 40 is disposed in the control circuit area 62 via the spacer portions 60b. In this way, the gap 64 is created between the rear surface of the printed circuit board 40 and the bottom surface 60a of the bottom portion 60. Thus, the heat generated by the first and second semiconductor chips 31 and 32 heated less conducts to the printed circuit board 40 via the main circuit board 20, the metal base board 23, and the bottom portion 60. Thus, the thermal interference with the control ICs 42 mounted on the printed circuit board 40 is reduced.

The spacer portions 60b are each shaped in a column, a prism, a circular truncated cone, or a truncated pyramid, for example. In particular, when the individual spacer portion 60b is shaped in a circular truncated cone or a truncated pyramid, the printed circuit board 40 is stably disposed in the control circuit area 62, and a less area of the printed circuit board 40 comes into contact with the spacer portions 60b. Thus, these spacer portions 60b are able to stably support the printed circuit board 40 and reduce the thermal interference with the printed circuit board 40. The spacer portions 60b each have a thickness between 0.5 mm and 10 mm, inclusive. If the individual spacer portion 60b is too thin, the thermal interference reduction effect is reduced. If the individual spacer portion 60b is too thick, the thickness of the semiconductor device 10 is increased. Thus, it is preferable that the thickness of the individual spacer portion 60b be set appropriately. By forming such a plurality of spacer portions 60b in the control circuit area 62, the printed circuit board 40 is stably disposed in the control circuit area 62. In addition, it is preferable that the total area of the spacer portions 60b be between 5% and 25%, inclusive, of the gap 64 in a plan view. If this total area is too small, it becomes difficult to stably dispose the printed circuit board 40. If the total area is too large, it becomes difficult to reduce the thermal interference. In addition, it is preferable that the spacer portions 60b satisfy the following conditions in the control circuit area 62 and be formed evenly. The first embodiment assumes an example in which the plurality of spacer portions 60b are formed along a side wall portion 71 at the locations illustrated in FIG. 2. The spacer portions 60b are formed at locations such that, when the printed circuit board 40 is disposed in the control circuit area 62, the spacer portions 60b do not overlap the control ICs 42 mounted on the printed circuit board 40. Thus, since the control ICs 42 are away from the spacer portions 60b to which the heat has conducted, the thermal interference is further reduced. In addition, the spacer portions 60b are formed such that the gap 64 is located under the control ICs 42. By forming the gap 64 under the control ICs 42, the thermal interference with the control ICs 42 from the main circuit board 20 is reduced. In addition, preferably, the spacer portions 60b are formed to be located under the connection areas of the upper circuit patterns of the printed circuit board 40, the upper circuit patterns being directly connected to the bonding wires 33 and 43. In this way, disconnection of the connection portions between the upper circuit patterns of the printed circuit board 40 and the bonding wires 33 and 43 is prevented. The location of the spacer portion 60b illustrated in FIG. 2 is only an example satisfying these conditions.

The frame portion 70 has a frame shape in a plan view. The frame portion 70 has side wall portions 71 to 74 integrally formed with each side of the bottom portion 60. The frame portion 70 surrounds the bottom portion 60, and an open area 75 is formed. All the side wall portions 71 to 74 have the same height. The side wall portions 71 and 73 are formed along the long sides of the bottom portion 60. The side wall portion 73 and the bottom portion 60 are integrally provided with the main current connection terminal 80a to 80e along with the side wall portion 73. In addition, the side wall portion 71 and the bottom portion 60 are integrally provided with the control terminals 90 along the side wall portion 71.

The individual main current connection terminal 80 has an L shape in a side view as illustrated in FIG. 2. Specifically, the individual main current connection terminal 80 is formed as a plate material bent in an L shape. For example, the individual main current connection terminal 80 has a thickness of 100 μm or more and less than 1.0 mm and a width between 1.0 mm and 10 mm, inclusive. The main current connection terminal 80a includes an external connection portion 81a and an internal connection portion 82a. The external connection portion 81a has one end that extends upward from the top surface of the side wall portion 73. The other end is integrally connected to one end of the internal connection portion 82a inside the side wall portion 73 and the bottom portion 60. The other end of the internal connection portion 82a is exposed from the bottom portion 60. The other end of the internal connection portion 82a is electrically and mechanically connected to a circuit pattern 22 via bonding wires 33. Likewise, the main current connection terminals 80b to 80e have external connection portions 81b to 81e and internal connection portions 82b to 82e. The external connection portions 81b to 81e each have one end that extends upward from the top surface of the side wall portion 73, and the other end of each of the external connection portions 81b to 81e is integrally connected to one end of a corresponding one of the internal connection portions 82b to 82e inside the side wall portion 73 and the bottom portion 60. The other end of each of the internal connection portions 82b to 82e is exposed from the bottom portion 60. The other end of each of the internal connection portions 82b to 82e is electrically and mechanically connected to a corresponding circuit pattern 22 via bonding wires 33. When the external connection portions 81a to 81e and the internal connection portions 82a to 82e of the main current connection terminals 80a to 80e do not particularly need to be distinguished from each other, any one of these portions 81a to 81e and any one of these portions 82a to 82e will be referred to as an external connection portion 81 and an internal connection portion 82 as illustrated in FIG. 2. The individual main current connection terminal 80 is made of material having excellent electrical conductivity. Examples of the material include copper, aluminum, nickel, and an alloy containing at least one of these kinds. The surface of the individual main current connection terminal 80 may be plated with nickel or a nickel alloy.

The individual control terminal 90 has a hook shape (a J shape) in a side view as illustrated in FIG. 2. Specifically, the individual control terminal 90 is formed as a prismatic or cylindrical member bent in a J shape. For example, the diameter or diagonal line of a cross section of the individual control terminal 90 is between 100 μm and 2.0 mm, inclusive. The individual control terminal 90 includes an external terminal portion (first end portion) 91 extending upward from the side wall portion 71 and an internal terminal portion (second end portion) 92 extending upward from the bottom surface 60a of the bottom portion 60. In addition, the individual control terminal 90 includes an intermediate portion that connects the corresponding internal terminal portion 92 and the corresponding external terminal portion 91 and that is embedded in the case 50. The intermediate portion is connected to the lower end of the external terminal portion 91 on the top surface of the side wall portion 71, extends downward inside the side wall portion 71, extends toward the open area 75 inside the bottom portion 60, extends upward inside the bottom portion 60, and is connected to the lower end of the internal terminal portion 92 on the bottom surface 60a. In addition, the internal terminal portion 92 of the individual control terminal 90 passes through a corresponding through-hole 41 of the printed circuit board 40. The internal terminal portion 92 of the individual control terminal 90 may also be connected to a corresponding through-hole 41 via solder (not illustrated). Each of the through-holes 41 may have a cylindrical shape. The diameter or diagonal line of the individual internal terminal portion 92 may be the same as or somewhat smaller than the inner diameter of a corresponding through-hole 41. The internal terminal portion 92 of the individual control terminal 90 may be press-fitted into a corresponding through-hole 41. To be press-fitted, the diameter or diagonal line of the internal terminal portion 92 may be the same as or somewhat larger than the inner diameter of a corresponding through-hole 41.

Since the printed circuit board 40 is connected to the internal terminal portions 92 of the control terminals 90 as described above, the printed circuit board 40 is not displaced from the control circuit area 62. In addition, the internal terminal portions 92 of the control terminals 90 are electrically connected to the upper circuit patterns or the lower circuit patterns of the printed circuit board 40. When the external terminal portion 91 of a control terminal 90 receives a control signal from the outside, the control signal travels to the internal terminal portion 92 of the control terminal 90 and the printed circuit board 40. Next, when the control signal is supplied from the printed circuit board 40 to a corresponding control IC 42, the control IC 42 outputs a control signal to the gate electrode of a corresponding first semiconductor chip 31 via a bonding wire 43. These control terminals 90 are made of material having excellent electrical conductivity. Examples of the material include copper, aluminum, nickel, and an alloy containing at least one of these kinds. The surface of the individual control terminal 90 may be plated with nickel or a nickel alloy.

As described above, the rear surface of the printed circuit board 40 is supported by the spacer portions 60b. In addition, the printed circuit board 40 is connected to the internal terminal portions 92 of the control terminals 90 and is maintained in the control circuit area 62. Thus, the printed circuit board 40 is prevented from being displaced without using any bonding material and is disposed stably in the control circuit area 62 with the gap 64 from the bottom surface 60a.

The side wall portions 72 and 74 are formed along the short sides of the bottom portion 60. The side wall portions 72 and 74 may be provided with holes for attaching a cooling device to the rear surface of the semiconductor device 10. By attaching a cooling device (not illustrated) to the rear surface of the semiconductor device 10 (the rear surface of the metal base board 23) via solder, silver solder, heat radiation grease, or a heat radiation sheet, the heat radiation performance is improved. In this case, metal material having excellent thermal conductivity is used as the main component of the cooling device, for example. Examples of this metal material include aluminum, iron, silver, copper, and an alloy containing at least one of these kinds. For example, a heatsink or a water-cooled cooling device may be used as the cooling device. Alternatively, the metal base board 23 may be integrated with the cooling device as described above.

The open area 75 of the case 50 including the parts as described above is filled with the sealing material 95, to seal the open area 75 with the sealing material 95. The sealing material 95 contains thermosetting resin and inorganic filler contained therein. For example, the thermosetting resin contains as its main component at least one kind selected from a group including epoxy resin, phenol resin, and melamine resin. Preferably, the thermosetting resin contains epoxy resin as its main component. In addition, inorganic material containing silicon oxide as its main component is used as the inorganic filler. A high flame retardance is achieved without blending halogen-based, antimony-based, or metal hydroxide-based flame retardant, for example. The inorganic filler is between 70 vol % and 90 vol % of the sealing raw material, inclusive.

The sealing material 95 is also injected into the gap 64 between the rear surface of the printed circuit board 40 and the bottom surface 60a of the bottom portion 60. For example, different bonding material may be included in the gap 64, other than the sealing material 95. As the different bonding material in this case, for example, thermosetting resin adhesive or organic adhesive is used. The thermosetting resin adhesive contains, for example, epoxy resin or phenol resin as its main component. The organic adhesive is, for example, elastomeric adhesive containing silicone rubber or chloroprene rubber as its main component. Preferably, material containing epoxy resin or silicone rubber as its main component is used, as used for attaching the metal base board 23. The gap 64 does not need to be completely sealed with the sealing material 95. That is, voids may be included in the gap 64. Preferably, the voids are formed in the gap 64 between the rear surface of the printed circuit board 40 and the bottom surface 60a, the gap 64 being under the control ICs 42. In this way, the control ICs 42 are less subject to the thermal interference due to the heat generated by the first and second semiconductor chips 31 and 32. Thus, for example, the spacer portions 60b may be formed to correspond to the outlines of the control ICs 42 on the bottom surface 60a such that the voids are formed under the control ICs 42. That is, the individual spacer portion 60b in this case has a frame shape in a plan view. Since the areas inside their respective spacer portions 60b each having a frame shape are not filled with the sealing material 95, voids are formed in the spacer portions 60b. In the present embodiment (FIG. 1), these spacer portions 60b may be formed to correspond to the four control ICs 42.

In addition, preferably, no voids are formed in the gap 64 under the connection areas of the upper circuit patterns of the printed circuit board 40, the connection areas being directly connected bonding wires 43. That is, it is preferable that the gap 64 under the connection areas be filled with the sealing material 95 or bonding material. This is because, if a void is formed under a connection area, the stress and warp caused when the semiconductor device 10 is operated could cause disconnection between an upper circuit pattern of the printed circuit board 40 and a bonding wire 33 or 43.

FIGS. 1 and 2 illustrate a case in which the main circuit board 20 and the printed circuit board 40 are disposed to correspond to the main circuit area 61 and the control circuit area 62, respectively. If the capacity of the semiconductor device 10 is increased, the area of the main circuit board 20 may also be increased such that its heat radiation performance is also improved. However, there are cases in which downsizing of the semiconductor device 10 is demanded. Thus, there are cases in which the border between the main circuit area 61 and the control circuit area 62 reaches under the printed circuit board 40. That is, the main circuit area 61 is expanded, and the control circuit area 62 is reduced. In this way, it is possible to increase the area of the main circuit board 20 to correspond to the expanded main circuit area 61 while maintaining the size of the semiconductor device 10 (the area of the bottom portion 60). If the area of the printed circuit board 40 is maintained, the main circuit board 20 partially overlaps the printed circuit board 40 in a plan view.

In this case, it is possible to expand the main circuit board 20 to locations under the control ICs 42 disposed on the printed circuit board 40.

Figure 3:
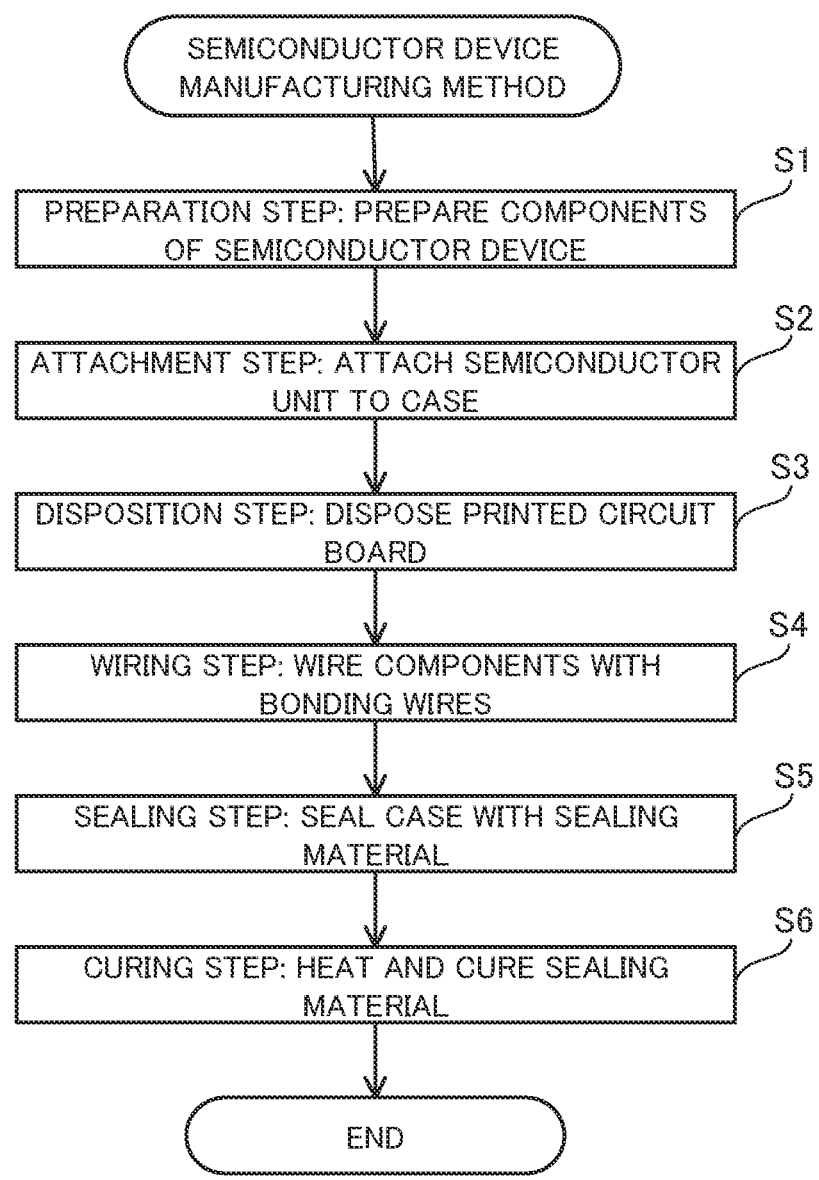
FIG. 3 is a flowchart illustrating a manufacturing method of the semiconductor device according to the first embodiment.

Next, a manufacturing method of the semiconductor device 10 will be described with reference to FIG. 3. FIG. 3 is a flowchart illustrating a manufacturing method of the semiconductor device 10 according to the first embodiment. First, a preparation step of preparing components of the semiconductor device 10 is performed (step S1 in FIG. 3). The components of the semiconductor device 10 include the case 50 including the first and second semiconductor chips 31 and 32, the main current connection terminals 80, and the control terminals 90, the printed circuit board 40, and the sealing raw material, etc., which have been described with reference to FIGS. 1 and 2. At this point, the semiconductor unit 30 has already been assembled.

Next, an attachment step of attaching the semiconductor unit 30 to the case 50 from the rear side of the case 50 is performed (step S2 in FIG. 3). In this step, the metal base board 23 is attached to the opening portion 63 of the rear surface of the bottom portion 60 of the case 50 via bonding material such that the main circuit board 20 is exposed to the outside in the main circuit area 61 of the bottom portion 60.

Next, the printed circuit board 40 is disposed in the control circuit area 62 of the bottom portion 60 of the case 50. Next, the control ICs 42 are mounted on the printed circuit board 40 via electrically conductive adhesive or solder (step S3 in FIG. 3). In this step, the internal terminal portions 92 of the control terminals 90 of the case are inserted into the through-holes 41 of the printed circuit board 40 from the rear surface of the printed circuit board 40. The internal terminal portions 92 of the control terminals 90, the internal terminal portions 92 protruding upward from the through-holes 41, may be soldered to the through-holes 41. The internal terminal portions 92 of the control terminals 90 may be press-fitted to the through-holes 41. The rear surface of the printed circuit board 40 is supported by the spacer portions 60b in the control circuit area 62 of the bottom portion 60.

Next, a wiring step of appropriately wiring the main circuit board 20, the printed circuit board 40, and the main current connection terminals 80 with the bonding wires 33 and 43 is performed (step S4 in FIG. 3). Since the printed circuit board 40 is connected and fixed to the internal terminal portions 92 of the control terminals 90, displacement of the printed circuit board 40 from the control circuit area 62 is prevented, and the wiring with the bonding wires 33 and 43 is performed appropriately.

Next, liquid sealing material is injected into the open area 75 of the case 50 (step S5 in FIG. 3). By injecting the sealing material in a vacuum, it is possible to tightly seal the case 50 with the sealing material without creating voids. In addition, before the sealing material is injected, defoaming for removing voids is performed in a vacuum. After this defoaming, the melted sealing material is agitated in a vacuum to achieve complete defoaming. In this way, generation of voids is further reduced.

Next, a curing step is performed (step S6 in FIG. 3). First, the case 50 whose open area 75 has been filled with the liquid sealing material is heated at a predetermined temperature. The temperature is between 120° C. and 180° C., inclusive. The liquid sealing material is consequently is cured and becomes the sealing material 95. Thus, the semiconductor device 10 illustrated in FIGS. 1 and 2 is manufactured.

Figure 4:
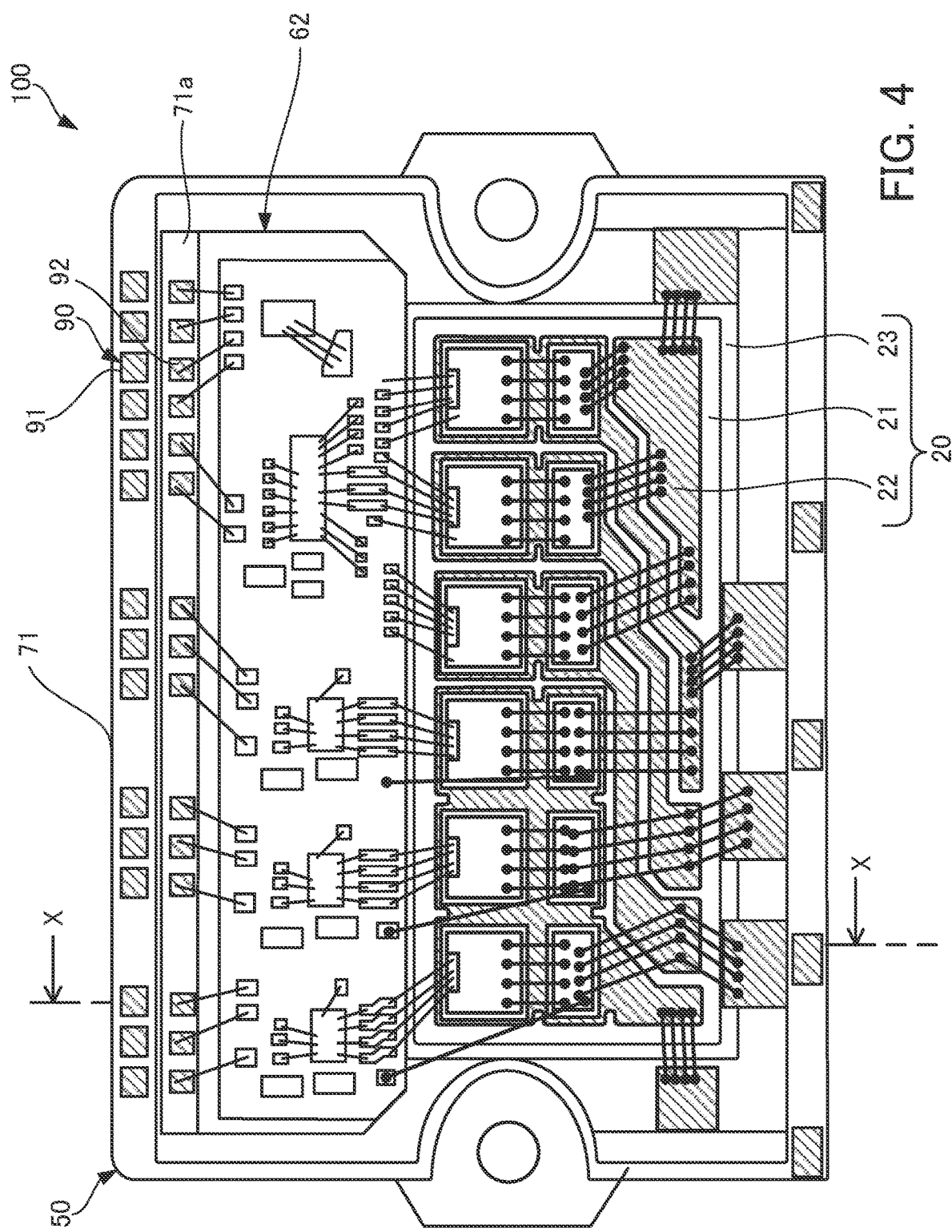
FIG. 4 is a plan view of a semiconductor device according to a reference example.
Figure 5:
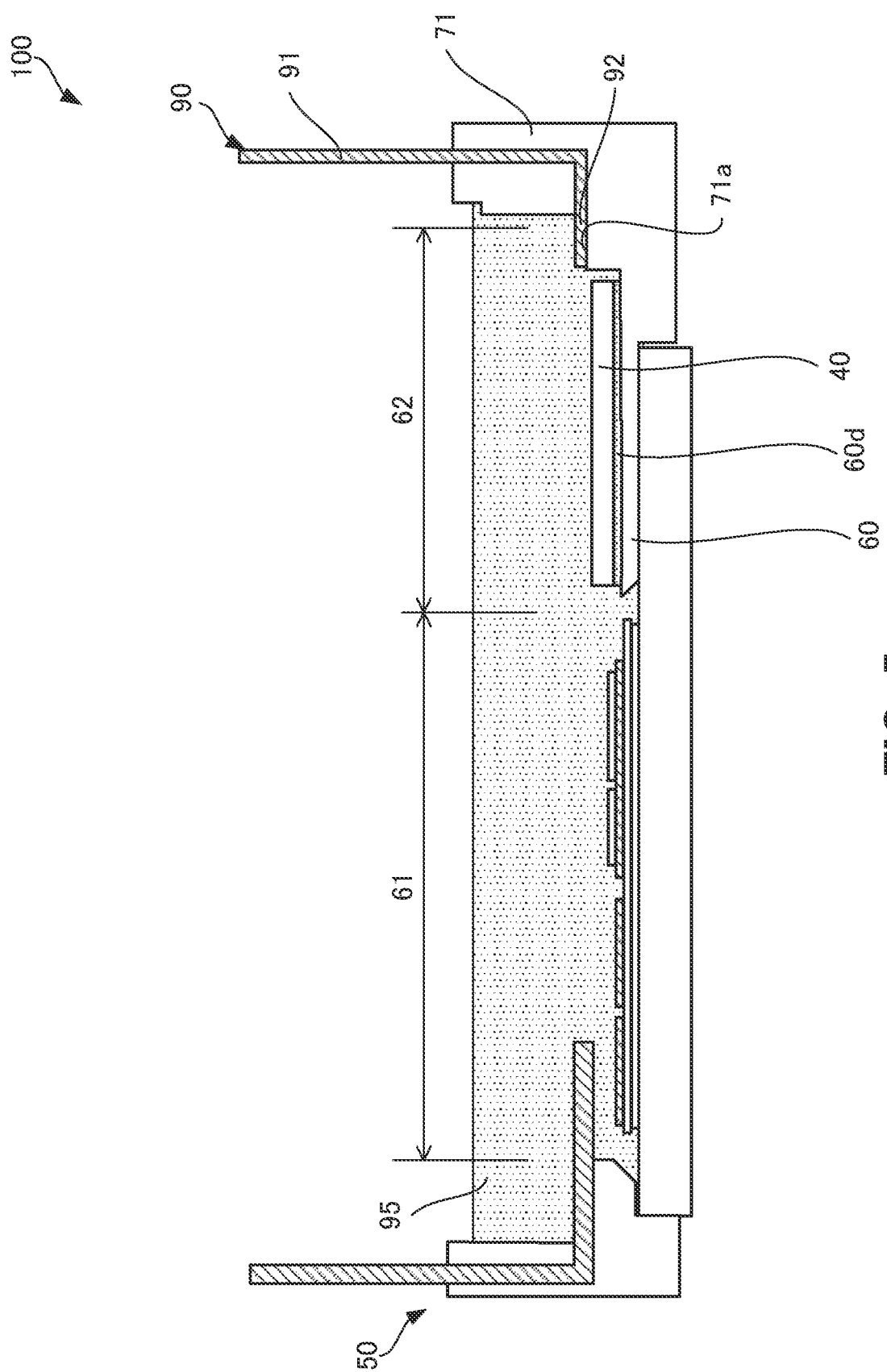
FIG. 5 is a sectional view of the semiconductor device according to the reference example.

Hereinafter, a semiconductor device 100, which is a reference example of the semiconductor device 10, will be described with reference to FIGS. 4 and 5. FIG. 4 is a plan view of a reference example of the semiconductor device. FIG. 5 is a sectional view of the reference example of the semiconductor device. The sealing material is not illustrated in FIG. 4. FIG. 5 is a sectional view taken along a dashed-dotted line X-X in FIG. 4. In FIGS. 4 and 5, components different from those of the semiconductor device 10 and components used in the following description will be denoted by reference characters.

The semiconductor device 100 differs from the semiconductor device 10 in the following points. The semiconductor device 100 includes control terminals 90, each of which includes an external terminal portion 91 and an internal terminal portion 92. The individual external terminal portion 91 extends upward from a side wall portion 71. The individual internal terminal portion 92 does not pass through a through-hole 41 in a printed circuit board 40 and is exposed on a step portion 71a formed on the side wall portion 71. The external terminal portion 91 and the internal terminal portion 92 of the individual control terminal 90 are connected to each other in an L shape in the side wall portion 71. The exposed internal terminal portion 92 of the individual control terminal 90 is electrically and mechanically connected to an upper circuit pattern of the printed circuit board 40 via a bonding wire 33. In addition, no spacer portions 60b are formed in a control circuit area 62 of a bottom portion 60 of a case 50. The printed circuit board 40 is firmly fixed in the control circuit area 62 of a bottom surface 60a via bonding material 60d. Other configurations of the semiconductor device 100 are the same as those of the semiconductor device 10, and description thereof will be omitted.

With this semiconductor device 100, the heat generated by the first and second semiconductor chips 31 and 32 heated conducts to the printed circuit board 40 via a main circuit board 20, a metal base board 23, and the bottom portion 60 (and the bonding material 60d). Thus, control ICs 42 mounted on the printed circuit board 40 are subject to the thermal interference. In this case, if the guaranteed operating temperature of a control IC 42 is lower than those of the first and second semiconductor chips 31 and 32, before the temperature reaches the guaranteed operating temperatures of the first and second semiconductor chips 31 and 32, the guaranteed operating temperature of the control IC 42 is reached. Thus, even when the control IC 42 used at the guaranteed operating temperatures or lower of the first and second semiconductor chips 31 and 32, if the temperature exceeds the guaranteed operating temperature of the control IC 42, the control IC 42 malfunctions and is damaged. That is, use of the semiconductor device 100 is limited by the temperature.

In contrast to the semiconductor device 100, the semiconductor device 10 includes the semiconductor unit 30 including the main circuit board 20, which includes the insulating plate 21, the circuit patterns 22 formed on the front surface of the insulating plate 21, and the metal base board 23 formed on the rear surface of the insulating plate 21, and the first and second semiconductor chips 31 and 32 bonded to the circuit patterns 22, and the printed circuit board 40. The semiconductor device 10 also includes the case 50. The case 50 includes the plate-like bottom portion 60 and the side wall portions 71 to 74 formed in a frame shape along outer edges of the bottom portion 60. The main circuit area 61 set for the bottom surface 60a of the bottom portion 60 corresponds to the insulating plate 21 in a plan view and is open, and the semiconductor unit 30 is attached in the main circuit area 61 from the rear surface of the bottom portion 60. In addition, the printed circuit board 40 is disposed in the control circuit area 62 adjacent to the main circuit area 61 set for the bottom surface 60a of the bottom portion 60 of the case 50 via the spacer portions 60b, and the gap 64 is formed between the printed circuit board 40 and the bottom surface 60a of the bottom portion 60. Thus, the printed circuit board 40 is less subject to the thermal interference due to the heat generated by the first and second semiconductor chips 31 and 32 heated, and a rise in the temperature of the printed circuit board 40 is reduced. Accordingly, the control ICs 42 disposed on the printed circuit board 40 are also less subject to the thermal interference. Thus, since use of the semiconductor device 10 is not limited by the guaranteed operating temperature of the individual control IC 42, the semiconductor device 10 is usable at a temperature equal to or more than the guaranteed operating temperature of the individual control IC 42. As a result, the reliability of the semiconductor device 10 is improved.

In addition, a rise in the temperature of the printed circuit board 40 is reduced. Thus, the heat resistance of the printed circuit board 40 is reduced, and the selectivity of the elements used for the printed circuit board 40 is expanded. As a result, the manufacturing cost is reduced. In addition, since no bonding material is used to dispose the printed circuit board 40, the steps of applying and curing bonding material are omitted. In addition, a step of connecting the printed circuit board 40 and the control terminals 90 via bonding wires 33 is not needed. Thus, the manufacturing cost of the semiconductor device 10 is reduced.

Figure 6:
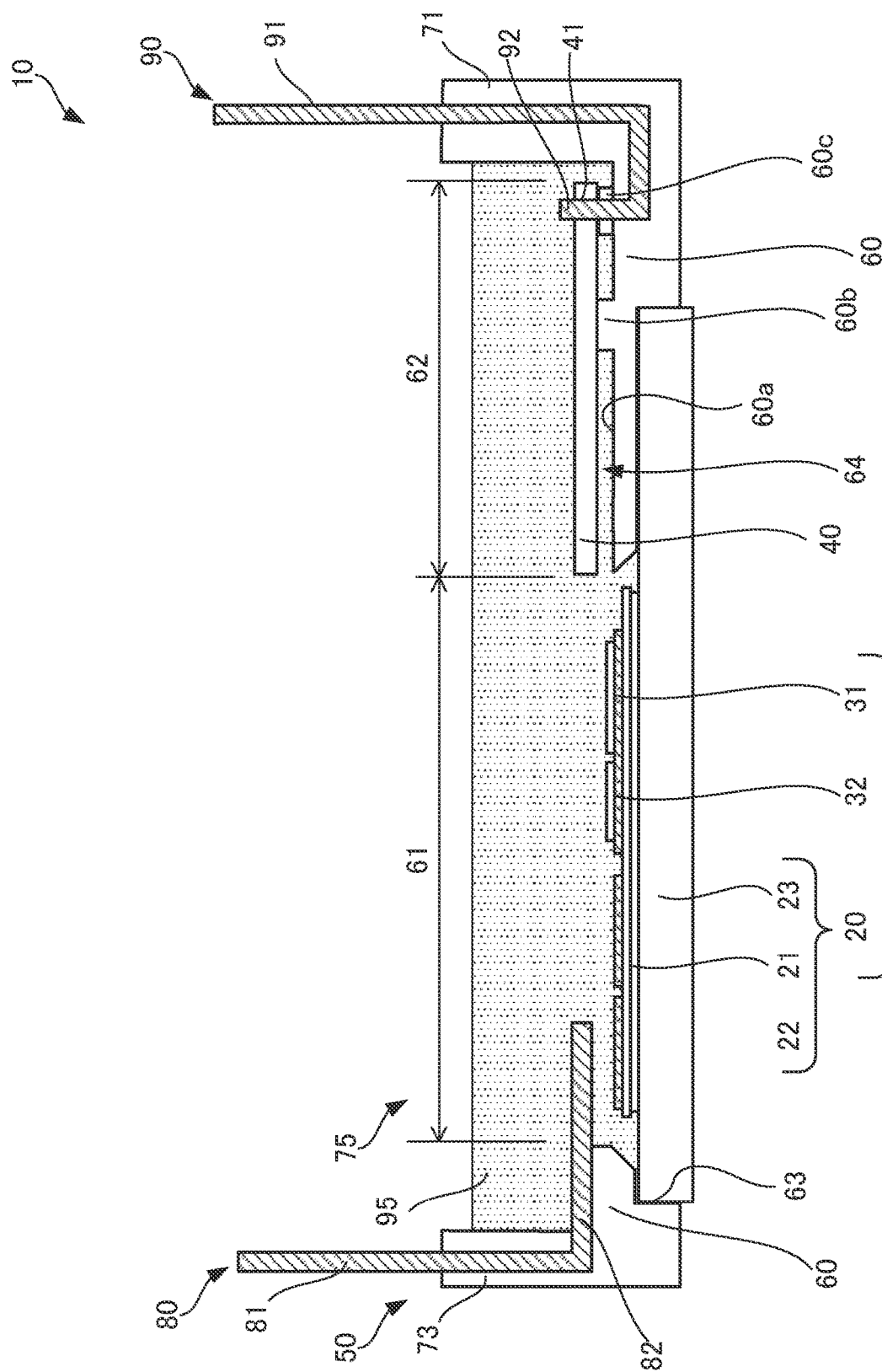
FIG. 6 is a sectional view of a semiconductor device according to a variation of the first embodiment.

Next, a semiconductor device 10 according to a variation will be described with reference to FIG. 6. FIG. 6 is a sectional view of a semiconductor device 10 according to a variation of the first embodiment. FIG. 6 corresponds to the sectional view in FIG. 2. In the case of the semiconductor device 10 illustrated in FIG. 6, protective supporting portions 60c are formed on a bottom portion 60. The individual protective supporting portions 60c have the same height as that of the individual spacer portions 60b. As is the case with the spacer portions 60b, the individual protective supporting portion 60c may be made of the same material as that of a case 50 including the bottom portion 60 and may be formed integrally with the bottom portion 60. Alternatively, the protective supporting portions 60c may be made of material different from that of the case 50 and may separately be formed in the control circuit area 62 of the bottom portion 60. In this case, the protective supporting portions 60c each have a cylindrical shape in a plan view. An internal terminal portion 92 of an individual control terminal 90, the internal terminal portion 92 protruding from a bottom surface 60a of the bottom portion 60, passes through a corresponding protective supporting portion 60c and is connected to a corresponding through-hole 41 of a printed circuit board 40 from the rear surface of the printed circuit board 40. Other configurations of the semiconductor device 10 in FIG. 6 are the same as those of the semiconductor device 10 illustrated in FIGS. 1 and 2.

In the case of the semiconductor device 10 illustrated in FIG. 6, the protective supporting portions 60c are disposed with the spacer portions 60b. Thus, when the printed circuit board 40 is disposed in the control circuit area 62, since the printed circuit board 40 is supported by the spacer portions 60b and the protective supporting portions 60c, the printed circuit board 40 is disposed more stably. In addition, parts of the internal terminal portions 92 of the control terminals 90, the parts being exposed in the gap 64, are protected by the protective supporting portions 60c. Thus, for example, damage to the internal terminal portions 92 of the control terminals 90 is prevented.

Second Embodiment

Figure 7:
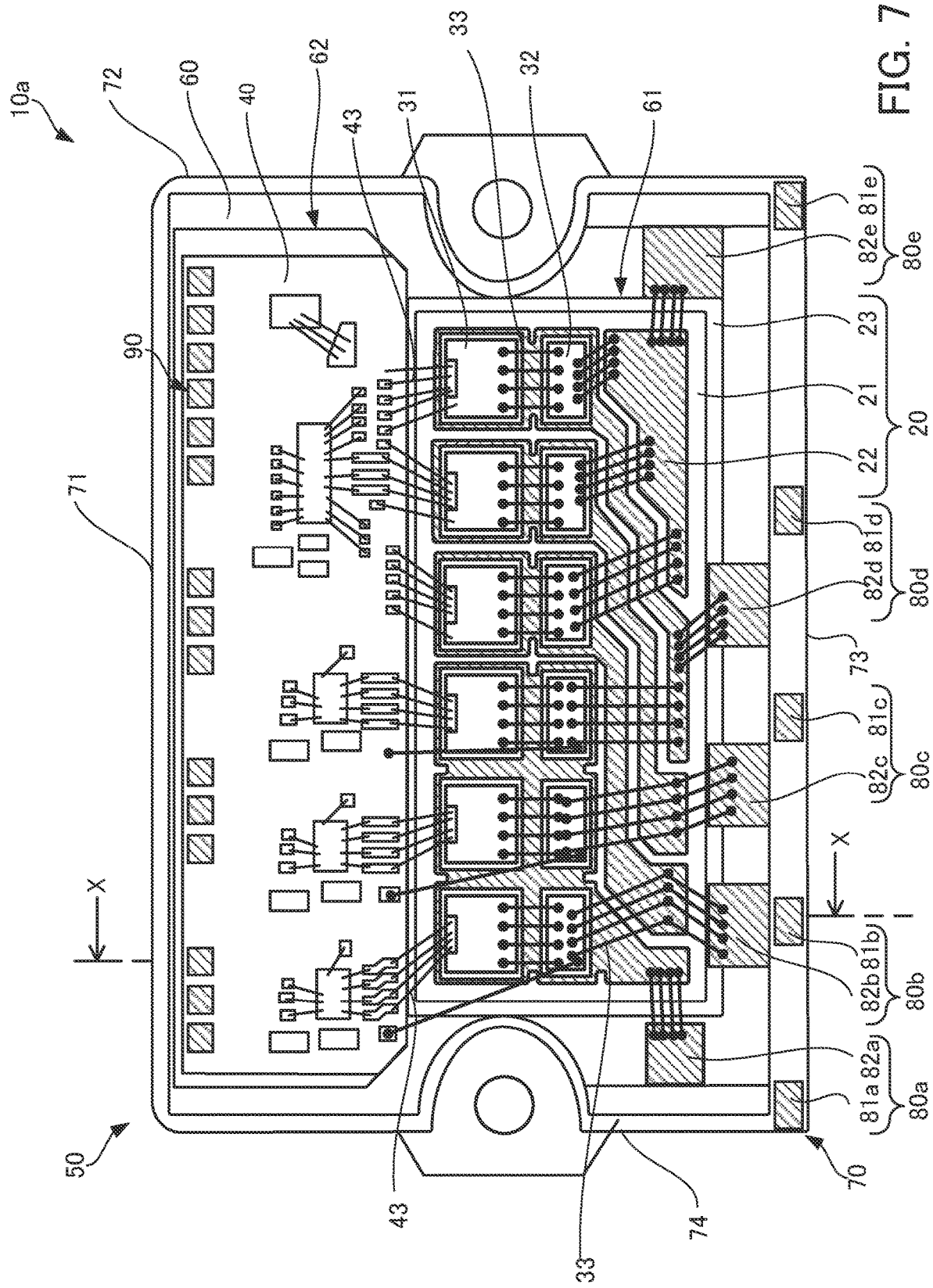
FIG. 7 is a plan view of a semiconductor device according to a second embodiment.
Figure 8:
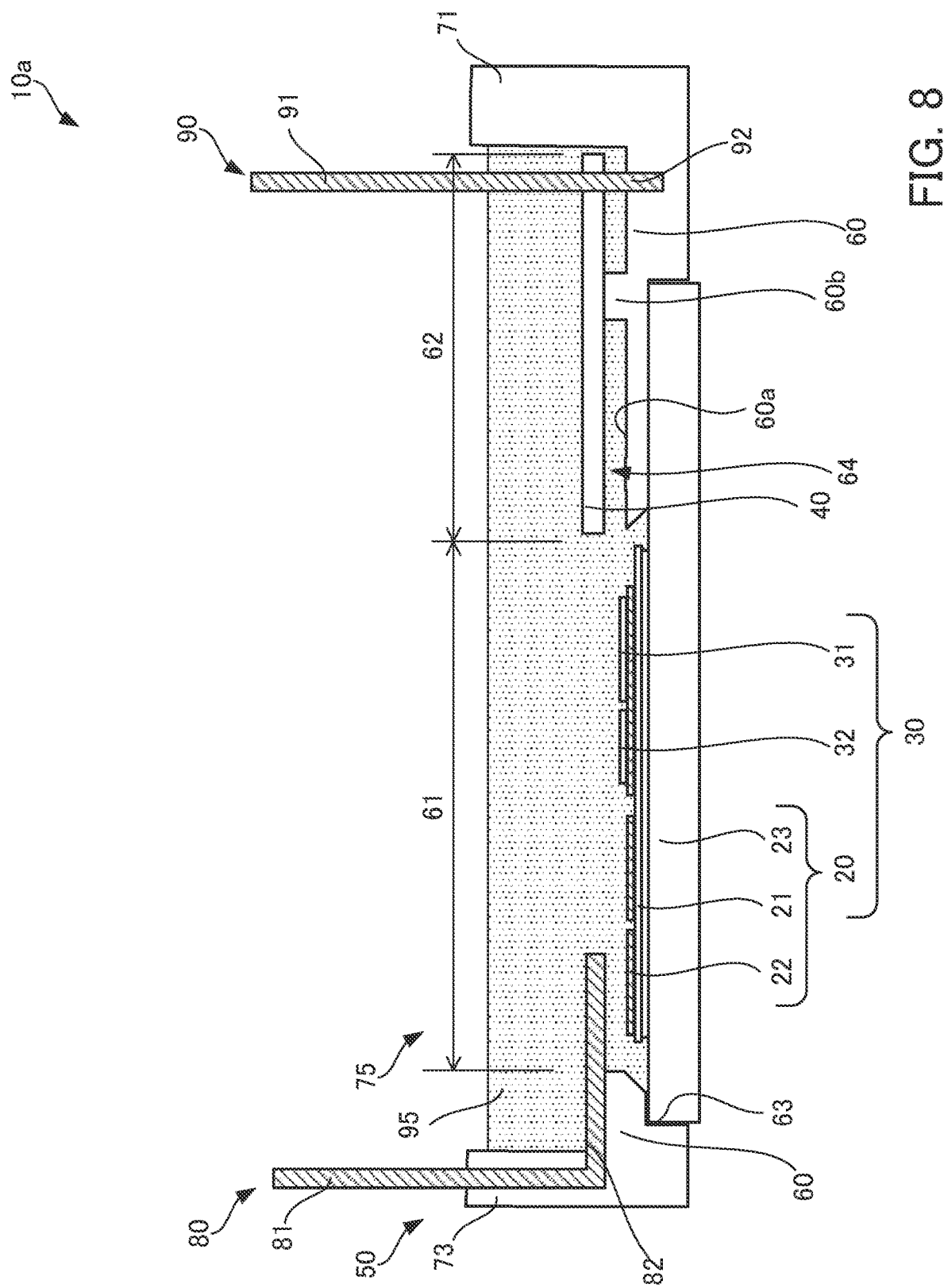
FIG. 8 is a sectional view of the semiconductor device according to the second embodiment.

A semiconductor device according to a second embodiment will be described with reference to FIGS. 7 and 8. FIG. 7 is a plan view of a semiconductor device according to a second embodiment. FIG. 8 is a sectional view of the semiconductor device according to the second embodiment. In FIG. 7, sealing material 95 is not illustrated. FIG. 8 is a sectional view taken along a dashed-dotted line X-X in FIG. 7. In FIG. 8, bonding wires 33 and 43 and control ICs 42 are not illustrated.

This semiconductor device 10a differs from the semiconductor device 10 in the following points. In the case of the semiconductor device 10a, control terminals 90 each have an external terminal portion 91 and an internal terminal portion 92 and each have a linear shape. Specifically, the individual control terminal 90 is formed as a rod-like prism or a cylindrical member. The individual control terminal 90 passes through a corresponding through-hole 41 of a printed circuit board 40, and the individual internal terminal portion 92 is approximately vertically embedded into a bottom portion 60. For example, the diameter or diagonal line of a cross section of the individual control terminal 90 is between 100 μm and 2.0 mm, inclusive. A part of the individual control terminal 90, the part corresponding to a corresponding through-hole 41 of the printed circuit board 40, may have the same size as or a somewhat smaller size than the inner diameter of the through-hole 41. Alternatively, the individual control terminal 90 may be press-fitted into a corresponding through-hole 41. The diameter or diagonal line of the part of the individual control terminal 90, the part corresponding to a corresponding through-hole 41 of the printed circuit board 40, may be the same as or somewhat larger than the inner diameter of the corresponding through-hole 41 such that the individual control terminal 90 is press-fitted into the corresponding through-hole 41. In addition, the diameter or diagonal line of a part above or below the part of the individual control terminal 90 corresponding to the corresponding through-hole 41 of the printed circuit board 40 may be smaller than the inner diameter of the corresponding through-hole 41. Since the printed circuit board 40 is connected to the internal terminal portions 92 of the control terminals 90 as described above, the printed circuit board 40 is not displaced from a control circuit area 62. Other configurations of the semiconductor device 10a are the same as those of the semiconductor device 10, and description thereof will be omitted.

As described above, the printed circuit board 40 of the semiconductor device 10a is also supported by spacer portions 60b from the rear surface of the printed circuit board 40 and is connected to the internal terminal portions 92 of the control terminals 90 embedded into the bottom portion 60. Thus, the printed circuit board 40 is not displaced from the control circuit area 62 without using any bonding material and is stably disposed in the control circuit area 62 with a gap 64.

Next, a manufacturing method of the semiconductor device 10a will be described with reference to FIG. 3. The description of the same steps as those according to the first embodiment will be simplified. First, a preparation step of preparing components of the semiconductor device 10a is performed (step S1 in FIG. 3). Examples of the components of the semiconductor device 10a include a case 50 including only first and second semiconductor chips 31 and 32 and main current connection terminals 80, the printed circuit board 40, and sealing raw material, etc. At this point, a semiconductor unit 30 has already been assembled, and the control terminals 90 have already been prepared.

Next, an attachment step of attaching the semiconductor unit 30 to the case 50 from the rear side of the case 50 is performed (step S2 in FIG. 3). Next, the control terminals 90 are inserted into the through-holes 41 of the printed circuit board 40. A disposition step of disposing the printed circuit board 40, into which the control terminals 90 have been inserted and to which the control terminals 90 have been connected, in the control circuit area 62 of the bottom portion 60 of the case 50. Next, the control ICs 42 are mounted on the printed circuit board 40 via solder (step S3 in FIG. 3). In this step, the rear surface of the printed circuit board 40 is supported by the spacer portions 60b in the control circuit area 62 of the bottom portion 60. In addition, the internal terminal portions 92 of the control terminals 90, which have been inserted into and connected to the through-holes 41 of the printed circuit board 40, are embedded into the bottom portion 60. As a result, since the printed circuit board 40 is connected to the internal terminal portions 92 of the control terminals 90 and is maintained in the control circuit area 62, the printed circuit board 40 is not displaced from the control circuit area 62. In this state, next, as in the first embodiment, steps S4 to S6 in FIG. 3 are performed. Thus, the semiconductor device 10a illustrated in FIGS. 7 and 8 is manufactured.

With this semiconductor device 10a, too, the printed circuit board 40 is less subject to the thermal interference due to the heat generated by the first and second semiconductor chips 31 and 32 heated, and a rise in the temperature of the printed circuit board 40 is reduced. Accordingly, the control ICs 42 disposed on the printed circuit board 40 are also less subject to the thermal interference. Thus, since use of the semiconductor device 10a is not limited by the guaranteed operating temperature of the individual control IC 42, the semiconductor device 10a is usable at a temperature equal to or more than the guaranteed operating temperature of the individual control IC 42. As a result, the reliability of the semiconductor device 10a is improved. In addition, since a rise in the temperature of the printed circuit board 40 is reduced, the heat resistance of the printed circuit board 40 is reduced, and the selectivity of the elements used for the printed circuit board 40 is expanded. As a result, the manufacturing cost is reduced. In addition, since no bonding member is used to dispose the printed circuit board 40, the steps of applying and curing bonding material are omitted. In addition, a step of connecting the printed circuit board 40 and the control terminals 90 via bonding wires 33 is not needed. In addition, since the case 50 of the semiconductor device 10a is simpler than the case 50 of the semiconductor device 10, the semiconductor device 10 is manufactured more easily. Thus, the manufacturing cost of the semiconductor device 10a is reduced.

The protective supporting portions 60c illustrated in FIG. 6 may be formed around the internal terminal portions 92 of the control terminals 90 of the semiconductor device 10 according to the first embodiment. In this case, too, the individual protective supporting portion 60c may have the same height as that of the individual spacer portion 60b, may be made of the same material as that of the case 50 including the bottom portion 60, and may be formed integrally with the bottom portion 60. Alternatively, the protective supporting portion 60c may be made of material different from that of the case 50, may have a cylindrical shape in a plan view, and may be disposed separately in the control circuit area 62 of the bottom portion 60.

Figure 9:
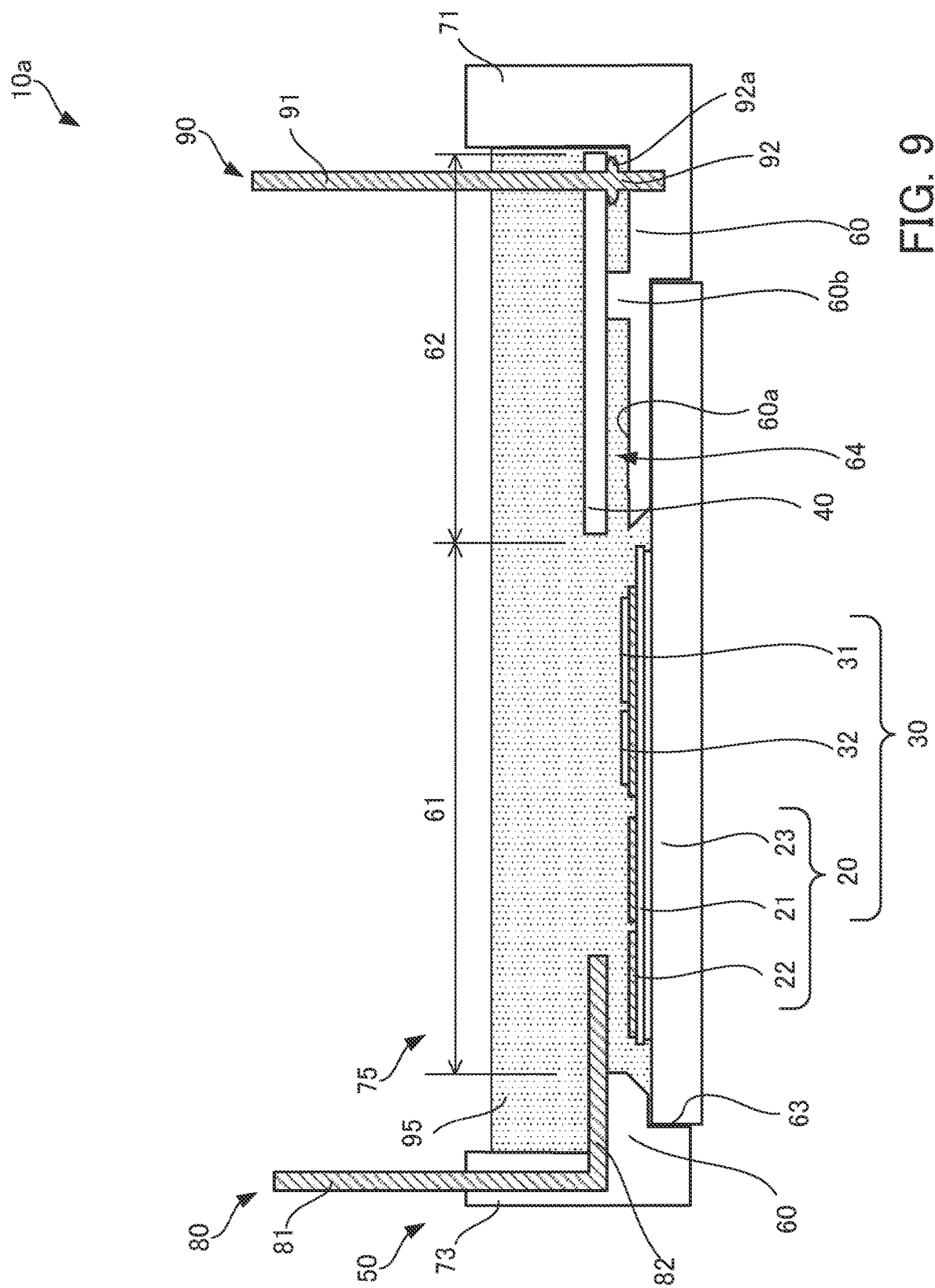
FIG. 9 is a sectional view of a semiconductor device according to a variation of the second embodiment.

Next, a semiconductor device 10a according to a variation will be described with reference to FIG. 9. FIG. 9 is a sectional view of a semiconductor device according to a variation of the second embodiment. FIG. 9 corresponds to the sectional view in FIG. 8. In the case of the semiconductor device 10a illustrated in FIG. 9, a supporting portion 92a is formed to protrude from a side surface of an internal terminal portion 92 of a corresponding control terminal 90 perpendicularly with respect to the extension direction of the control terminal 90. A supporting portion 92a may be formed in a ring around a surface of an internal terminal portion 92 of a control terminal 90. Alternatively, two or more supporting portions 92a may be formed discontinuously around a surface of an internal terminal portion 92 of a control terminal 90. These supporting portions 92a are formed by a conventionally known metal processing technique. In addition, the height of the individual supporting portion 92a is the same as or less than that of an individual spacer portion 60b. When the control terminals 90 are connected to through-holes 41 of a printed circuit board 40, the supporting portions 92a come into contact with the rear surface of the printed circuit board 40. In addition, external terminal portions 91 of the control terminals 90 are inserted into the through-holes 41 of the printed circuit board 40 from the rear surface of the printed circuit board 40, and the supporting portions 92a are brought into contact with the rear surface of the printed circuit board 40.

When the printed circuit board 40 to which the control terminals 90 have been connected are disposed in a control circuit area 62, the rear surface of the printed circuit board 40 is supported by the spacer portions 60b in the control circuit area 62 of a bottom portion 60. In addition, the internal terminal portions 92 of the control terminals 90 connected to the through-holes 41 of the printed circuit board 40 are embedded into the bottom portion 60. Since the printed circuit board 40 is consequently supported by the supporting portions 92a, the printed circuit board 40 is disposed in the control circuit area 62 more stably. The supporting portions 92a illustrated in FIG. 9 may be formed around the internal terminal portions 92 of the control terminals 90 of the semiconductor device 10 according to the first embodiment.

Third Embodiment

Figure 10:
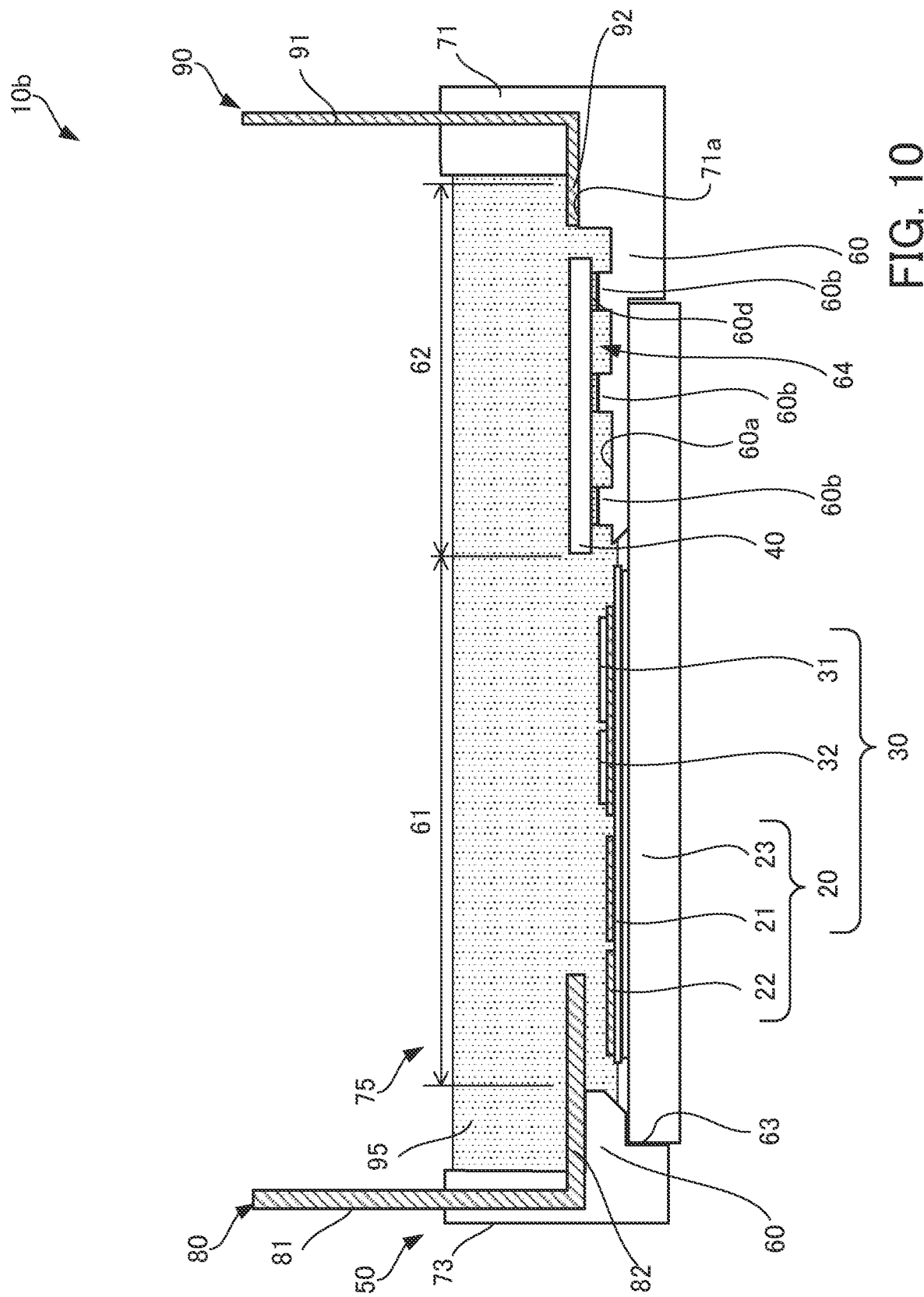
FIG. 10 is a sectional view of a semiconductor device according to a third embodiment.

A semiconductor device 10b according to a third embodiment will be described with reference to FIG. 10. FIG. 10 is a sectional view of a semiconductor device according to a third embodiment. A plan view of the semiconductor device 10b is the same as FIG. 4. FIG. 10 is a sectional view of the semiconductor device 10b taken along the dashed-dotted line X-X in FIG. 4. The semiconductor device 10b differs from the semiconductor device 100 in the following point. A plurality of spacer portions 60b are formed in a control circuit area 62 of a bottom portion 60 of a case 50 of the semiconductor device 10b. In this case, too, the individual spacer portion 60b may be made of the same material as that of the case 50 including the bottom portion 60 and may be formed integrally with the bottom portion 60. Alternatively, the individual spacer portion 60b may be made of material different from that of the case 50 and may be disposed separately in the control circuit area 62 of the bottom portion 60. However, in the third embodiment, it is preferable that the spacer portions 60b be made of the same material as that of the case 50 and may be formed integrally with the bottom portion 60. In this way, as will be described below, the printed circuit board 40 disposed on the spacer portions 60b is not displaced from the control circuit area 62. The printed circuit board 40 is disposed on the spacer portions 60b via bonding material 60d. Thus, an appropriate number of spacer portions 60b are formed at appropriate locations such that the printed circuit board 40 is stably disposed. Other configurations of the semiconductor device 10b are the same as those of the semiconductor device 100, and description thereof will be omitted.

The printed circuit board 40 of the semiconductor device 10b is disposed on the plurality of spacer portions 60b via the bonding material 60d in the control circuit area 62 of the bottom portion 60 of the case 50. As a result, a gap 64 is formed between the printed circuit board 40 and a bottom surface 60a of the bottom portion 60. In addition, since the printed circuit board 40 is firmly fixed in the control circuit area 62 via the bonding material 60d, the printed circuit board 40 is not displaced from the control circuit area 62.

Next, a manufacturing method of the semiconductor device 10b will be described with reference to FIG. 3. The description of the same steps as those according to the first embodiment will be simplified. First, a preparation step of preparing components of the semiconductor device 10b is performed (step S1 in FIG. 3). Examples of the components of the semiconductor device 10b include the case 50 including first and second semiconductor chips 31 and 32, main current connection terminals 80, and control terminals 90, the printed circuit board 40, and sealing raw material, etc. At this point, a semiconductor unit 30 has already been assembled. As illustrated in FIG. 10, the main current connection terminals 80 and the control terminals 90 have been formed integrally with the case 50. In addition, the plurality of spacer portions 60b have been formed integrally in the control circuit area 62 of the bottom portion 60 of the case 50.

Next, an attachment step of attaching the semiconductor unit 30 to the case 50 from the rear side of the case 50 is performed (step S2 in FIG. 3). Next, a disposition step of disposing the printed circuit board 40 on the plurality of spacer portions 60b via the bonding material 60d in the control circuit area 62 of the bottom portion 60 of the case 50 is performed. Next, control ICs 42 are mounted on the printed circuit board 40 via solder (step S3 in FIG. 3). Next, a wiring step of appropriately wiring the main circuit board 20, the printed circuit board 40, the main current connection terminals 80, and the control terminals 90 with bonding wires 33 and 43 is performed (step S4 in FIG. 3). Since the printed circuit board 40 is firmly fixed to the plurality of spacer portions 60b of the bottom portion 60 of the case 50 via the bonding material 60d, the printed circuit board 40 is not displaced from the control circuit area 62, and the wiring with the bonding wires 33 and 43 is appropriately performed. Next, as in the first embodiment, steps S5 and S6 in FIG. 3 are performed. Thus, the semiconductor device 10b illustrated in FIG. 10 is manufactured.

With this semiconductor device 10b, too, the printed circuit board 40 is less subject to the thermal interference due to the heat generated by the first and second semiconductor chips 31 and 32 heated, and a rise in the temperature of the printed circuit board 40 is reduced. Accordingly, the control ICs 42 disposed on the printed circuit board 40 are also less subject to the thermal interference. Thus, since use of the semiconductor device 10a is not limited by the guaranteed operating temperature of the individual control IC 42, the semiconductor device 10b is usable at a temperature equal to or more than the guaranteed operating temperature of the individual control IC 42. As a result, the reliability of the semiconductor device 10b is improved. In addition, since a rise in the temperature of the printed circuit board 40 is reduced, the heat resistance of the printed circuit board 40 is reduced, and the selectivity of the elements used for the printed circuit board 40 is expanded. As a result, the manufacturing cost is reduced.

The discussed technique reduces the thermal interference from semiconductor chips to a printed circuit board, improves the guaranteed operating temperature of a semiconductor device, and improves the reliability of the semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a semiconductor unit including a main circuit board, which includes an insulating plate, a circuit pattern formed on a front surface of the insulating plate, and a metal plate formed on a rear surface of the insulating plate, and a semiconductor chip bonded to the circuit pattern;
   a printed circuit board; and
   a case including a bottom portion formed in a plate-like shape and having a front surface and a rear surface opposite to each other, the rear surface facing outside the case, and a side wall portion surrounding an outer periphery of the bottom portion of the case, wherein the bottom portion has
      a main circuit area having an opening, the semiconductor unit being attached in the main circuit area from the rear surface of the bottom portion such that the insulating plate is exposed to inside the case through the opening, and
      a control circuit area adjacent to the main circuit area in a plan view of the semiconductor device, the printed circuit board being disposed in the control circuit area on the front surface of the bottom portion via a spacer, having a gap between the printed circuit board and the front surface of the bottom portion.

2. The semiconductor device according to claim 1, further comprising an external connection terminal having
   a first end portion, one end of which is exposed to outside of the semiconductor device and
   a second end portion that is electrically and mechanically connected to a side portion of the printed circuit board in the case, the side portion of the printed circuit board being located at a side of the printed circuit board opposite to a side of the printed circuit board facing the main circuit area.

3. The semiconductor device according to claim 2, wherein the second end portion penetrates the printed circuit board.

4. The semiconductor device according to claim 3, wherein
   the external connection terminal has an intermediate portion between the first end portion and the second end portion, and the intermediate portion is embedded in the bottom portion and the side wall portion of the case, and
   the second end portion extends from the front surface of the bottom portion so as to penetrate the printed circuit board, and the first end portion extends outwardly from the side wall portion.

5. The semiconductor device according to claim 4, wherein the second end portion penetrates the printed circuit board from a rear surface of the printed circuit board, the rear surface of the printed circuit board facing the front surface of the bottom portion of the case, to a front surface of the printed circuit board, thereby mechanically and electrically to be connected to the printed circuit board.

6. The semiconductor device according to claim 5, further comprising a supporting portion surrounding the second end portion and being disposed between the bottom portion of the case and the printed circuit board, to support the rear surface of the printed circuit board.

7. The semiconductor device according to claim 3, wherein
   the second end portion of the external connection terminal penetrates the printed circuit board from a front surface of the printed circuit board to a rear surface of the printed circuit board, the rear surface of the printed circuit board facing the front surface of the bottom portion of the case, a tip portion of the second end portion being embedded in the bottom portion from the front surface of the bottom portion, and
   the external connection terminal has an intermediate portion between the first end portion and the second end portion, which extends to the front surface of the semiconductor device inside the semiconductor device, and the first end portion extends outwardly from the semiconductor device.

8. The semiconductor device according to claim 1, wherein the printed circuit board is disposed such that the printed circuit board and the semiconductor chip are non-overlapping in the plan view.

9. The semiconductor device according to claim 8, wherein a front surface of the semiconductor chip is located at a position within the gap in a depth direction orthogonal to the front surface of the bottom portion of the case.

10. The semiconductor device according to claim 9, further comprising an electronic component on the printed circuit board, wherein
    the main circuit board is disposed in both the main circuit area and a portion of the control circuit area, the portion of the control circuit area corresponding to an area in which the electronic component is disposed on the printed circuit board in the plan view.

11. The semiconductor device according to claim 1, further comprising sealing material sealing the case, wherein the gap is filled with the sealing material.

12. The semiconductor device according to claim 11, wherein the gap contains the sealing material or a void.

13. The semiconductor device according to claim 1, further comprising an electronic component on the printed circuit board, wherein the spacer is disposed in the control circuit area, in an area other than an area in which the electronic component is disposed.

14. The semiconductor device according to claim 13, wherein the gap is formed below an area in which the electronic component is disposed in the plan view, between the printed circuit board and the front surface of the bottom portion.

\* \* \* \* \*